(12) United States Patent
Delucco et al.

(10) Patent No.: US 7,084,659 B2
(45) Date of Patent: Aug. 1, 2006

(54) POWER SUPPLY ARRANGEMENT FOR INTEGRATED CIRCUIT TESTER

(75) Inventors: Anthony Delucco, Beaverton, OR (US); William Devey, Beaverton, OR (US); Will A. Miller, Camas, WA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/024,536

(22) Filed: Dec. 28, 2004

(65) Prior Publication Data

US 2005/0194989 A1    Sep. 8, 2005

Related U.S. Application Data

(63) Continuation-in-part of application No. 10/458,342, filed on Jun. 9, 2003, now abandoned.

(51) Int. Cl.
*G01R 31/26*    (2006.01)
(52) U.S. Cl. ................. 324/765; 324/754; 324/761
(58) Field of Classification Search ............... None
See application file for complete search history.

(56) References Cited

U.S. PATENT DOCUMENTS

| 5,834,946 | A  | * | 11/1998 | Albrow et al. ............ 324/760 |
| 5,986,447 | A  | * | 11/1999 | Hanners et al. .......... 324/158.1 |
| 6,040,691 | A  | * | 3/2000  | Hanners et al. .......... 324/158.1 |
| 6,078,187 | A  | * | 6/2000  | Hanners et al. ............ 324/761 |
| 6,339,338 | B1 | * | 1/2002  | Eldridge et al. ............ 324/765 |

\* cited by examiner

*Primary Examiner*—Minh N. Tang
(74) *Attorney, Agent, or Firm*—John Smith-Hill; Smith-Hill and Bedell

(57) ABSTRACT

A test head for a semiconductor integrated circuit tester, the test head includes a power supply board mounted to a power distribution board and positioned between the power distribution board and a device interface board. The power supply board includes a power supply circuit having power supply input terminals for receiving electrical power at a voltage $V_{in}$ and force and return terminals for supplying regulated electrical power at a voltage $V_{out}$. The power supply board further includes a power connector for connecting the force and return terminals of the power supply circuit to power supply contact elements of the device interface board.

15 Claims, 4 Drawing Sheets

POWER SUPPLY ARRANGEMENT FOR INTEGRATED CIRCUIT TESTER

CROSS-REFERENCE TO RELATED APPLICATIONS

This application is filed as a continuation-in-part of patent application Ser. No. 10/458,342 filed Jun. 9, 2003, now abandoned, the entire disclosure of which is hereby incorporated by reference herein for all purposes.

Subject matter disclosed in this application may be considered to be related to matter disclosed in U.S. patent application Ser. No. 10/802,993 filed Mar. 16, 2004 and U.S. patent application Ser. No. 11/024,528 filed Dec. 28, 2004, the entire disclosure of each of which is hereby incorporated by reference herein for all purposes.

BACKGROUND OF THE INVENTION

This invention relates to a power supply arrangement for an integrated circuit tester.

A conventional semiconductor integrated circuit tester that is used in conjunction with failure analysis equipment for probing the semiconductor material of an integrated circuit device while stimulating the device comprises a test head that interfaces to a device under test (DUT) through a device interface board (DIB) and pin electronics that transmit stimulus signals to, and monitor response signals from, the DUT. The tester also includes a device power supply that is connected to power supply pins of the DUT for supplying regulated DC voltage to the DUT for operating the DUT during the test.

Several trends in design and manufacture of integrated circuits influence the magnitude of the current drawn by an integrated circuit device. In particular, as advances in fabrication technologies allow integrated circuit devices to be made with smaller features, integrated circuits can be designed to include larger numbers of transistors. As the number of transistors increases, the power demands of the IC device will generally increase; and if the operating voltage of the IC device remains the same, the current drawn by the IC device will increase.

However, the reduction in size of features of IC devices allows the devices to operate at higher frequencies and as operating frequencies of integrated circuits increase, the operating voltage of the integrated circuits generally decreases. Consequently, the reduction in size of device features may lead to increase in current both because of an increase in the number of transistors and because of a reduction in operating voltage. Many testers are designed for concurrent testing of several IC devices. When an IC tester is to test concurrently several low voltage, high current IC devices, it must be able to provide a substantial amount of current to the devices under test.

A typical IC device including a large number of clocked gates draws a relatively high current during the first part of a clock cycle, when many transistors are actively switching, and a relatively low current during the latter part of the clock cycle, after the transistors have switched. Further, the amount of current drawn can vary from cycle to cycle depending mainly on how many transistors switch during each particular cycle.

In at least one known IC tester, the tester's device power supply is positioned remote from the test head and force and return terminals of the power supply are connected through cables to respective conductive power distribution blocks adjacent the DIB. Each power distribution block includes an array of spring probe pins (commonly known as pogo pins) that engage power supply contact pads of the DIB and the DIB includes conductive traces that connect the power supply contact pads to the power supply ($V_{cc}$ and ground) terminals of the DUT. In this known tester, there is a relatively long conductive path between the terminals of the device power supply and the $V_{cc}$ and ground terminals of the DUT, and these long conductive paths may have substantial inductance and resistance. The inductance and resistance of the power supply path results in a change in voltage drop across the path impedance when the current supplied to the DUT changes, and this change in voltage drop results in a change in voltage between the $V_{cc}$ and ground terminals of the DUT. Changes in voltage at the power supply terminal of the DUT must be kept within specified limits in order for the DUT to operate properly. As the operating voltage of ICs decreases, acceptable variations in operating voltage also decrease.

One way to reduce the magnitude of variation in power supply voltage is to connect voltage regulating capacitors to the power supply lines at a location as close as possible to the DUT. However, as the demand for current increases and the tolerance for variation in power supply voltage decreases, the capacitors that are needed to provide the necessary voltage regulation become impractically large.

SUMMARY OF THE INVENTION

In accordance with a first aspect of the invention there is provided a test head for a semiconductor integrated circuit tester, the test head comprising a device interface board for receiving a device under test (DUT) and comprising power supply contact elements at one side of the board and conductive traces for connecting the power supply contact elements to power supply pins of the DUT, a power distribution board having a first side in spaced, parallel confronting relationship with said one side of the device interface board, a power supply board mounted to the power distribution board at the first side thereof and positioned between the power distribution board and the device interface board, wherein the power supply board comprises a power supply circuit having power supply input terminals for receiving electrical power at a voltage $V_{in}$ and force and return terminals for supplying regulated electrical power at a voltage $V_{out}$, and the power supply board further comprises a power connector for connecting the force and return terminals of the power supply circuit to the power supply contact elements of the device interface board.

In accordance with a second aspect of the invention there is provided an apparatus for testing an integrated circuit device under test (DUT) having a power input terminal for receiving current for powering the DUT, input terminals for receiving test signals, and output terminals for forwarding output signals that the DUT generates in response to the test signals, the apparatus comprising a plurality of tester channels for generating the test signals and for processing the DUT's output signals to determine how the DUT's output signals behave, a plurality of power modules, wherein each power module has a power output terminal and is operative to develop a supply voltage at the power supply output terminal and to deliver an output current to the power supply output terminal, and a device interface structure for delivering the test signals from the tester channels to the DUT's input terminals, for delivering the DUT's output signals to the tester channels, and for delivering output current from the power output terminal of each power module to the DUT's power input terminal.

BRIEF DESCRIPTION OF THE DRAWINGS

For a better understanding of the invention, and to show how the same may be carried into effect, reference will now be made, by way of example, to the accompanying drawings, in which.

For convenience and clarity, the following paragraphs describe the test head in a particular orientation. However, this is not intended to imply that the test head may not be used in other orientations or that the claims should be limited to a particular orientation.

DETAILED DESCRIPTION

Figure 1:
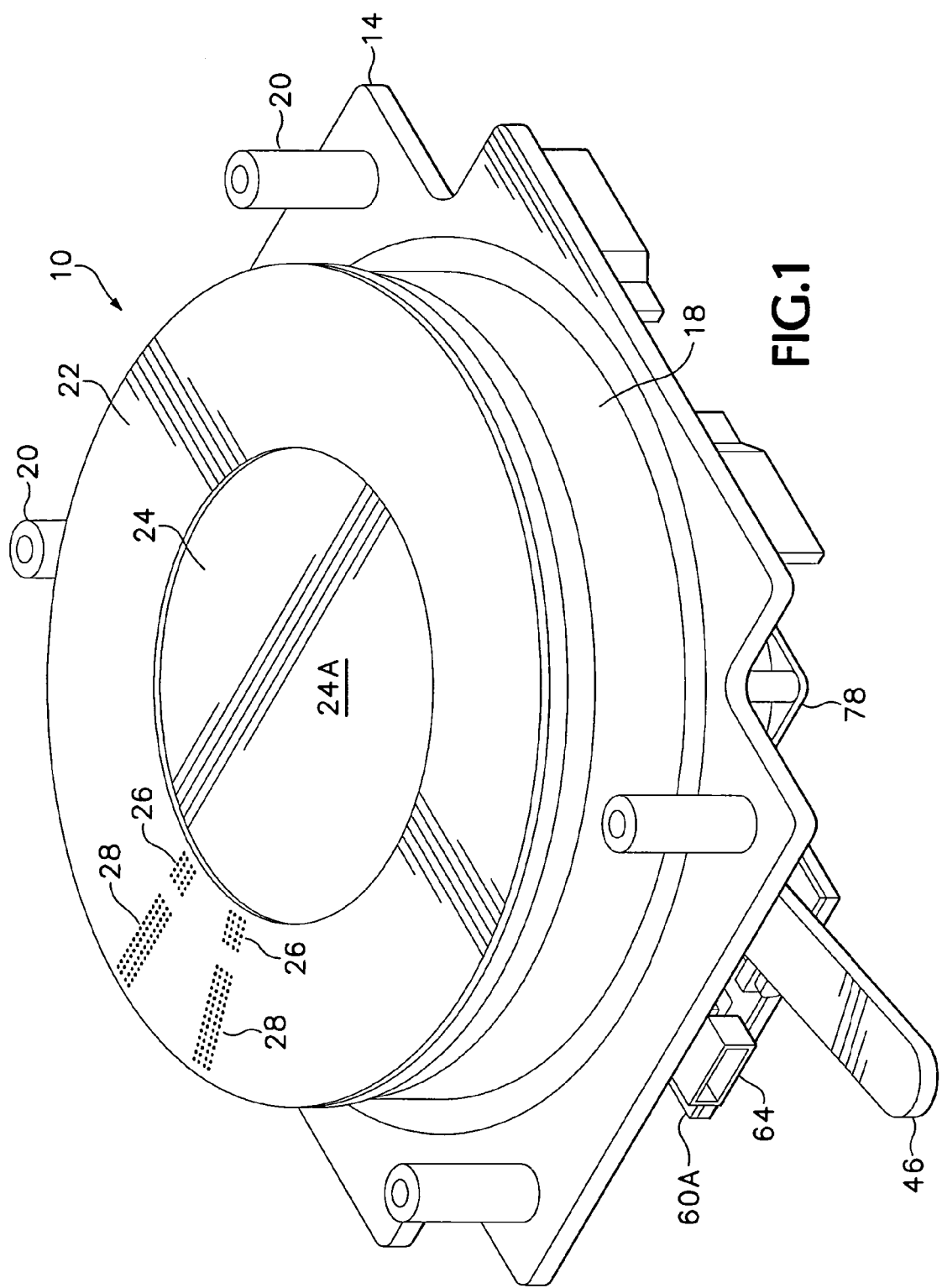
FIG. 1 is a perspective view of a test head embodying the present invention.

FIG. 1 illustrates a test head 10 comprising a main support plate 14 to which a cylindrical outer housing 18 is attached. Alignment pins 20 are secured to the main support plate 14 and are used for docking the test head to failure analysis equipment such as an electron beam probe.

Figure 3:
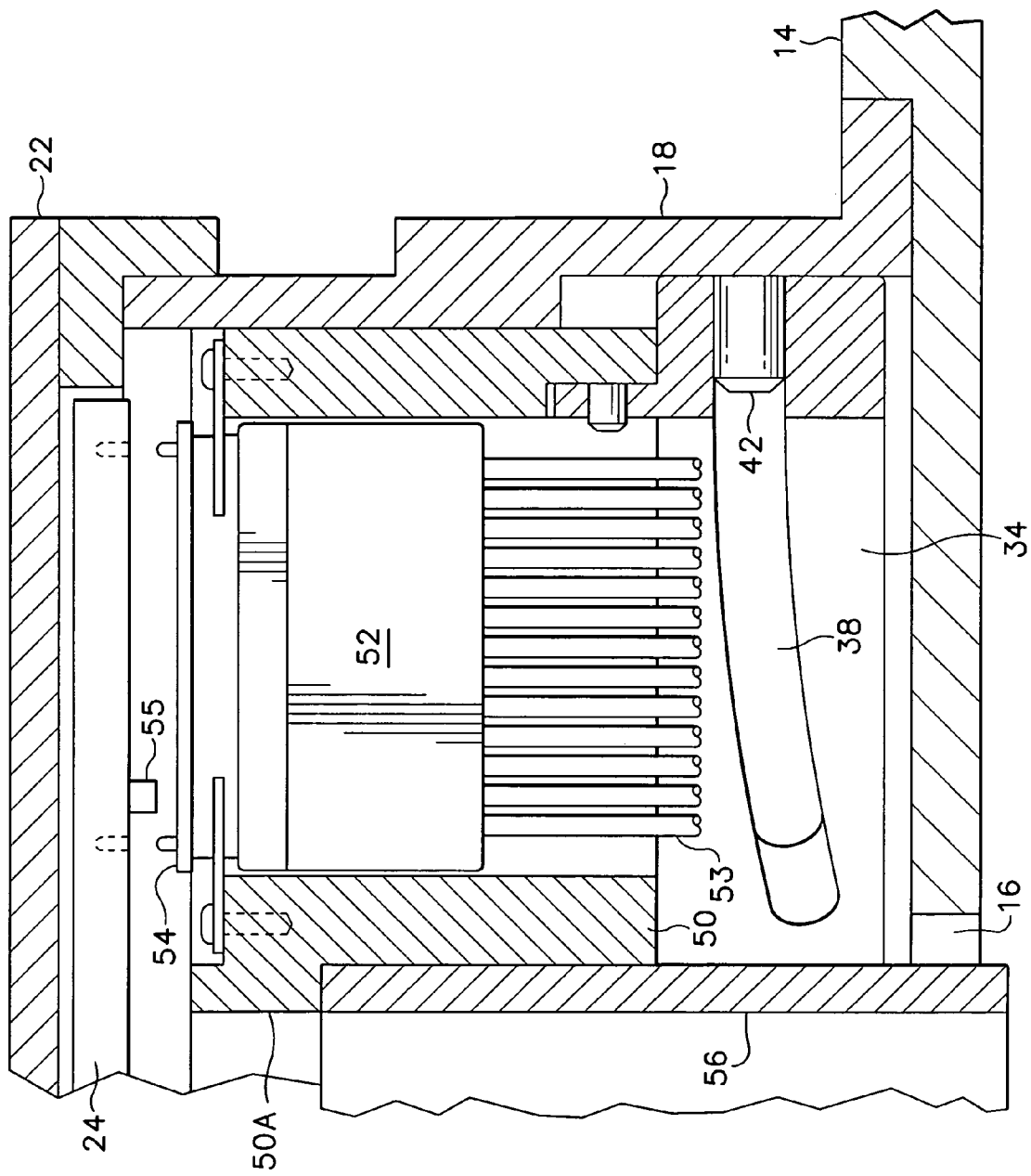
FIG. 3 is an enlarged partial sectional view of the test head.
Figure 4:
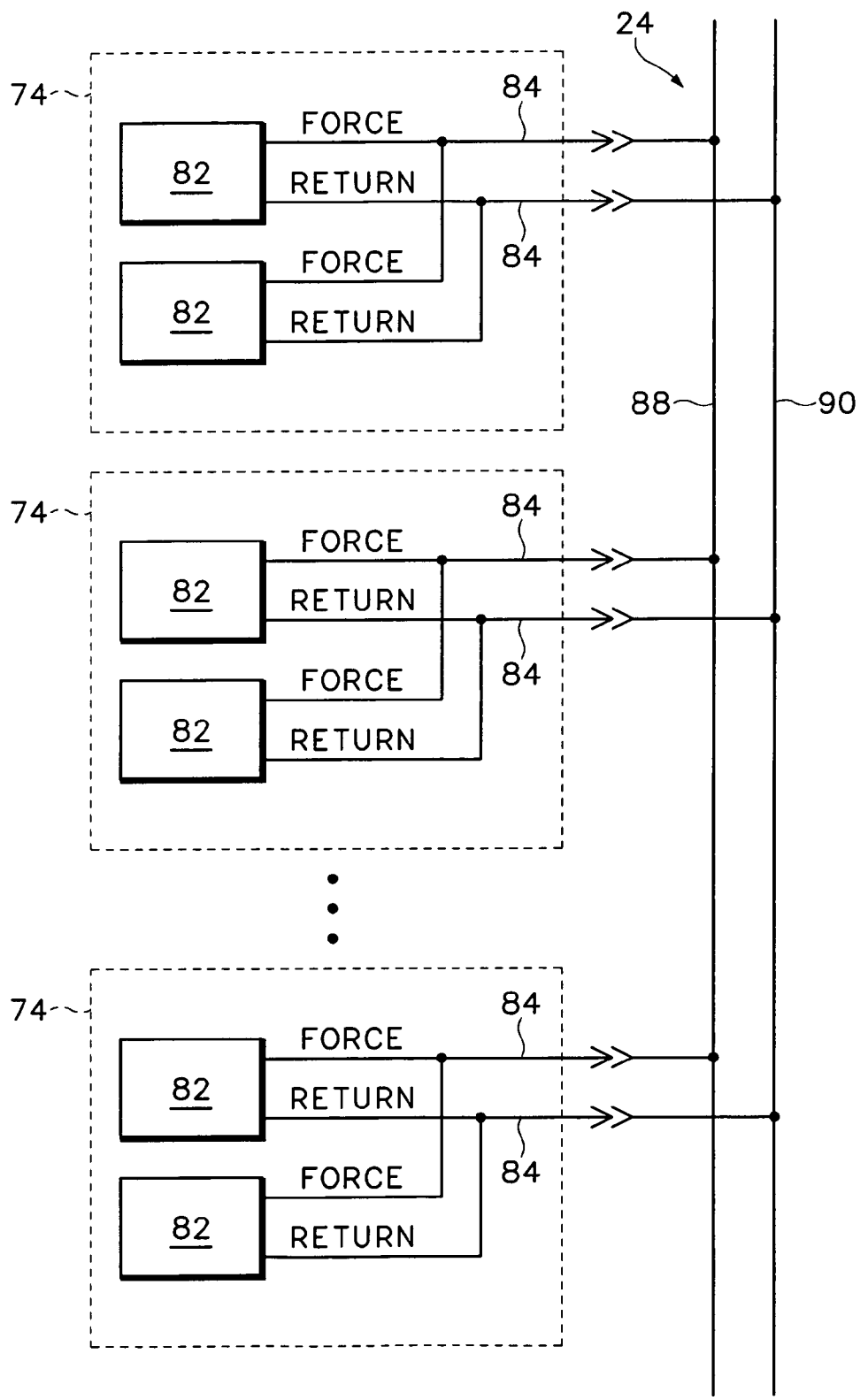
FIG. 4 illustrates schematically the power supply boards and the device interface board.

The main support plate 14 defines a circular opening 16 (FIG. 3). An annular cover plate 22 is attached to the outer housing 18. A circular device interface board (DIB) 24 (see FIG. 3 also) is accommodated within the cylindrical outer housing 18 and has a central region 24A that is exposed through the central opening in the annular cover plate 22. Several DUT sockets (not shown) are attached to the DIB in the central region 24A for receiving respective semiconductor integrated circuit devices under test. Each DUT socket includes power supply pins for supplying operating power to the DUT and signal pins for supplying test signals to, and receiving test signals from, the DUT.

The DIB 24 is formed with two concentric annular arrays of contact elements each comprising a via, the lower end of which is exposed at the underside of the DIB, and an annular contact pad surrounding the lower end of the via. The locations of the contact elements are illustrated schematically in FIG. 1 by the dots on the cover plate 22. The inner annular array of contact elements is composed of sixteen discrete groups 26 of contact elements (the locations of only two groups are shown) in respective sector-shaped regions of the inner array. The contact elements of the inner array include power supply contact elements that are connected through conductive traces of the DIB to the power supply pins of the DUT sockets. The contact elements of the inner array also include control signal contact elements. The outer annular array of contact elements is composed of sixteen discrete groups 28 of contact elements (the locations of only two groups are shown) in respective sector-shaped regions of the outer array. The contact elements of the outer array are test signal contact elements and are connected through conductive traces of the DIB to the signal pins of the DUT sockets.

Referring to FIG. 3, a cam ring 34 is located above the support plate 14 and within the outer housing 18. The cam ring is coaxial with the outer housing and is formed with multiple helical cam slots 38, only one of which is shown in the drawings. Cam followers 42 attached to the outer housing 18 project radially into the cam slots 38 respectively. The cam ring 34 is attached to a cam operating lever 46 (FIG. 1) that can be actuated to rotate the cam ring relative to the outer housing and thereby raise or lower the cam ring relative to the main support plate 14.

Referring again to FIG. 3, an annular connector support frame 50 is located inside the outer housing 18 and is restrained against rotation within the outer housing 18. The support frame 50 is located in a manner that allows it to move vertically relative to the main support plate 14 and is coupled to the cam ring 34 in a manner that permits relative rotational movement of the cam ring and the support frame but prevents relative vertical movement of the cam ring and the support frame. The support frame 50 defines multiple radial slots that accommodate respective electrical connectors 52, which may be as described in copending patent application Ser. No. 10/802,993 filed Mar. 16, 2004. The mounting of the connectors 52 in the support frame permits a small range of movement of the connectors 52 relative to the support frame 50.

Each connector 52 includes a cable positioning block in which the ends of multiple coaxial cables 53 are held, with the conductive cores of the coaxial cables exposed at the upper surface of the positioning block. Above the cable positioning block is a contact device 54 comprising an insulating member having multiple C-shaped conductive elements accommodated therein.

The DIB 24 is positioned over the support frame 50 and is captive beneath the cover plate 22. Alignment elements (not shown) limit angular movement of the DIB relative to the outer housing 18. Alignment pins 55 project downward from the DIB and are received in alignment bores of the support frame 50 and thereby position the DIB relative to the support frame when the support frame is forced upward by actuation of the cam operating lever 46. Alignment pins project upwards from the connectors 52 and are received in alignment bores of the DIB 24, thereby positioning the connectors relative to the DIB.

Each of the sixteen groups of contact elements 28 on the lower surface of the DIB 24 corresponds to one of the connectors 52, and the pattern of contact elements in each group 28 matches the pattern of the conductive cores of the coaxial cables 53 held by the corresponding connector. When the frame 50 is forced upward relative to the main support plate 14 by actuation of the lever 46, the C-shaped conductive elements of the contact device 54 provide electrical connections between the coaxial cables and respective pads on the underside of the DIB 24.

Figure 2:
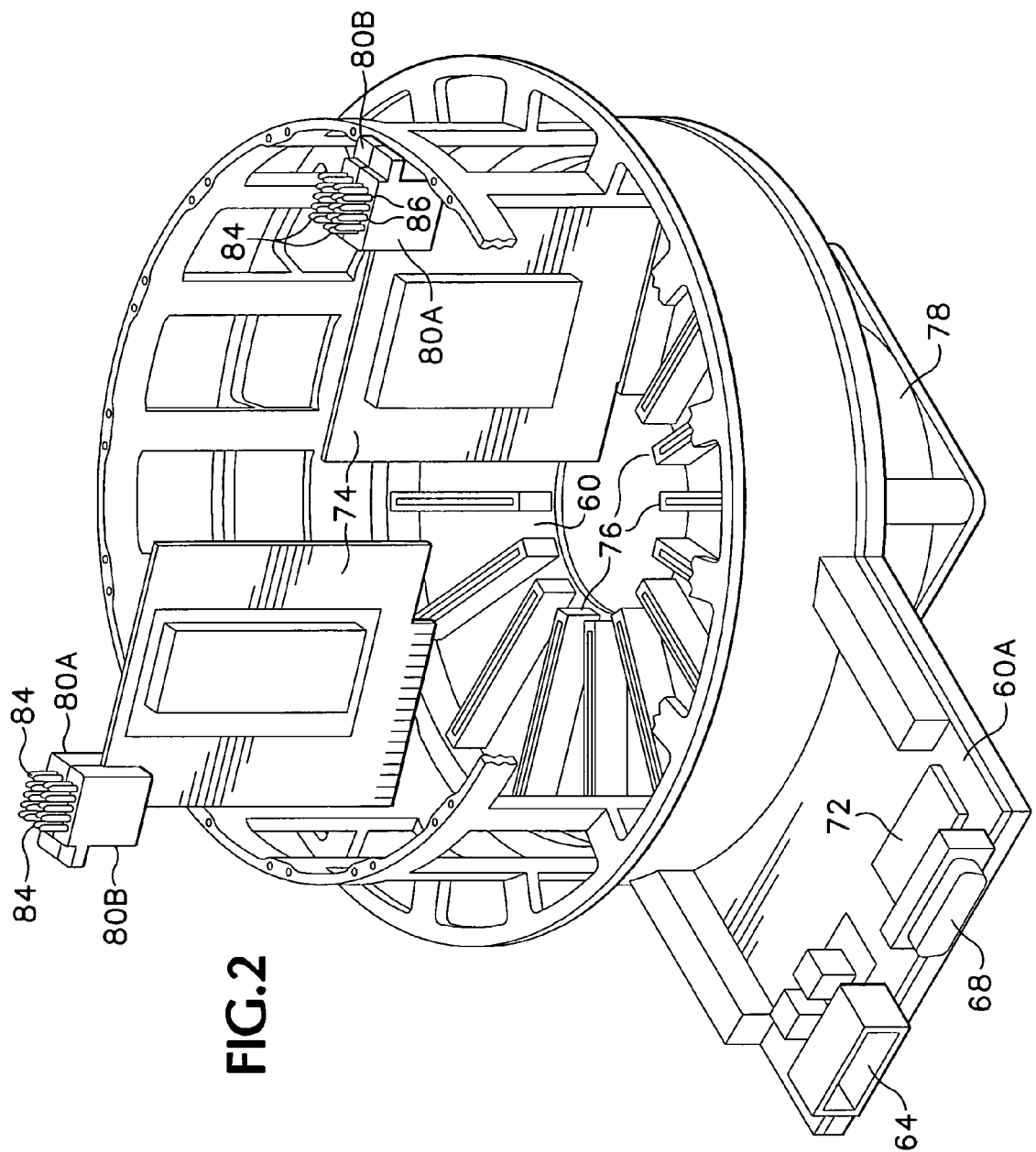
FIG. 2 is a partial perspective view of the test head and shows the power distribution board and power supply boards.

At its upper end, the support frame 50 has an internal flange or lip 50A (FIG. 3). A generally cylindrical inner frame 56 is attached at its upper end to the flange 50A of the support frame 50 and extends downward from the support frame through the circular opening 16 of the main support plate 14. The inner frame 56 is attached at its lower end to a generally annular power distribution board 60 (FIG. 2). Thus, the power distribution board is coupled to the support frame 50 by the inner frame 56 and moves vertically relative to the main support plate when actuation of the cam operating lever 46 raises and lowers the support frame.

The power distribution board 60 has a generally rectangular extension 60A, which can be seen in FIGS. 1 and 2. The power distribution board extension 60A is provided with a power connector 64 and a control connector 68. In an alternative implementation, there are two diametrically opposed extensions and one extension is provided with the power connector and the other is provided with the control connector. When the test head is in use, terminals of the power connector 64 are connected to a source of unregulated DC power that provides, for example, +12V, +48V and +5V. A power supply controller 72 is mounted on the extension 60A and has terminals connected to pins of the control connector 68.

Sixteen power supply connectors 76 are attached to the upper surface of the power distribution board 60. The connectors 76 extend radially of the board 60 and are equiangularly distributed about the center of the power distribution board 60. Each connector 76 has power supply pins that are connected to the terminals of the power connector 64 and has control pins that are connected to terminals of the power supply controller 72.

A fan 78 is positioned below the power distribution board 60 and induces a flow of cooling air through the central opening in the power distribution board.

Up to sixteen power module boards 74 are fitted in the connectors 76 respectively. Each power module board is generally rectangular and is disposed in a vertical orientation. Two electrically conductive power connection blocks 80A, 80B, which are electrically insulated from each other, are attached to the power module board at its upper edge. Each power connection block 80 has an extension flange that extends over the internal flange 50A of the support frame 50 (not shown in FIG. 2) and is formed with an alignment bore that receives an alignment pin projecting upward from the internal flange 50A, thereby holding the power connection blocks in position relative to the support frame.

Each power module board implements two power modules 82 as described in U.S. patent application Ser. No. 10/458,342. Each power module includes a DC/DC converter and has force and return terminals that are connected to force and return layers respectively of the power module board. The force layer is connected to the power connection block 80A and the return layer is connected to the power connection block 80B.

As mentioned in patent application Ser. No. 10/458,342, each power module implements several control functions, such as voltage measurement and adjustment, selective enabling of the power supplies, and load sharing. Signals that are used in implementation of these functions are conveyed between the power supply modules and the power supply controller 72 by the connector 76 and conductive traces of the power distribution board 60.

Each power connection block incorporates multiple spring probe pins 84. Each spring probe pin 84 comprises a metal barrel, a metal plunger fitted in the barrel, and a metal compression spring held in the barrel and forcing the plunger upward relative to the barrel. The metal barrels of the spring probe pins 84 are fitted directly in the respective power connection blocks and accordingly the plunger of each pin 84 is electrically connected to the power connection block in which the respective pin is mounted. The power connection block 80A incorporates several additional spring probe pins 86. The barrels of the spring probe pins 86 are mounted in the power connection block 80A using insulating sleeves, and accordingly the plungers of the pins 86 are insulated from the power connection block.

Each of the sixteen groups 26 of contact elements on the lower surface of the DIB 24 corresponds to one pair of connection blocks 80A, 80B, and the pattern of contact elements 26 in each group matches the pattern of the spring probe pins mounted in the corresponding connection blocks. Accordingly, when the cam operating lever is actuated to rotate the cam ring 34 in the sense to raise the frame 50 so that the contact device 54 establishes electrical connection between the connectors 52 and the signal pads on the lower side of the DIB, the pins 84, 86 engage respective contact elements on the underside of the DIB. Preferably, the vias of the contact elements are hollow and the spring probe pins 84, 86 have sharp conical tips that enter the lower ends of the hollow vias. The spring probe pins contact the rims of the vias and the inner periphery of the annular pads, thus providing a relatively large contact area and reducing the contact resistance between the pins and the contact elements. When the support frame 50 is in its lower position, the spring probe pins 84 and 86 are spaced from the DIB 24.

The conductive traces of the DIB 24 provide several control buses (not shown). The number of control buses is equal to the number of spring probe pins 86 in each power connection block 80A. The contact elements that are engaged by the spring probe pins 86 of the power connection block 84 are connected to the control buses respectively. In the illustrated embodiment of the invention, there are four control buses. Two of the control buses are sense buses that provide signals reflecting current operating conditions of the DIB and the other two control buses convey analog signals that are used to support particular functions of the power modules. In the illustrated embodiment, the latter two buses are a group enable bus and a load share bus respectively. The pins 86 are connected to the functional blocks that are used in implementing the control functions of the power module.

The contact elements that are engaged by the spring probe pins 84 mounted in the power connection block 80A are connected to a force bus 88 of the DIB and the contact elements that are engaged by the spring probe pins 84 mounted in the power connection block 80B are connected to a return bus 90 of the DIB. The force and return buses of the DIB are connected to the power supply pins of the DUT sockets. The two sense buses are connected to the force and return buses respectively.

Each power module provides regulated DC voltage to the DIB. Because the power module boards are close to the DIB, the conductive paths between the force and return terminals of the power module and the power and ground terminals of the DUT are short and have a low equivalent series resistance (ESR) and a low equivalent series inductance (ESL) and accordingly variations in voltage at the DUT power and ground terminals due to changes in current are small. Consequently, any capacitors that might be needed in order to reduce the magnitude of power supply voltage transients can be small.

Because the power module boards move relative to the DIB 24 in order to establish connection with the DIB, it is not necessary to employ flexible cables, including loops of slack cable that accommodate movement of the power module boards, for connecting the force and return terminals of the power modules to the DIB. This avoids a potential source of ESR and ESL.

It will be appreciated that the invention is not restricted to the particular embodiment that has been described, and that variations may be made therein without departing from the scope of the invention as defined in the appended claims and equivalents thereof. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. Further, a reference in the foregoing description to an element, be it a reference to one instance of that element or more than one instance, is not intended to imply that any claim should be interpreted as if it required that element or that embodiments of the invention could not be implemented without that element.

The invention claimed is:

1. A test head for a semiconductor integrated circuit tester, the test head comprising:
   a device interface board for receiving a device under test (DUT) and comprising power supply contact elements at one side of the board and conductive traces for connecting the power supply contact elements to power supply pins of the DUT,
   a power distribution board having a first side in spaced, parallel confronting relationship with said one side of the device interface board,
   a power supply board mounted to the power distribution board at the first side thereof and positioned between the power distribution board and the device interface board, wherein the power supply board comprises a power supply circuit having power supply input terminals for receiving electrical power at a voltage $V_{in}$ and force and return terminals for supplying regulated electrical power at a voltage $V_{out}$, and the power supply board further comprises a power connector for connecting the force and return terminals of the power supply circuit to the power supply contact elements of the device interface board.

2. A test head according to claim 1, wherein the device interface board is substantially circular and the power supply board is positioned radially with respect to the device interface board.

3. A test head according to claim 2, wherein the device interface board comprises signal contact pads at said one side of the board and conductive traces for connecting the signal contact pads to signal pins of the DUT, and wherein the power supply contact elements and the signal contact pads are in respective annular arrays.

4. A test head according to claim 1, wherein the power connector comprises an array of spring probe connector pins mounted to the power supply board and in electrically conductive pressure contact with the power supply contact elements of the device interface board.

5. A test head according to claim 1, wherein the power supply board has first and second opposite sides and comprises first and second power supply circuits at said first and second sides thereof respectively, each power supply circuit having power supply input terminals and force and return terminals, and the power connector comprises a first array of spring probe connector pins at the first side of the power supply board and a second array of spring probe connector pins at the second side of the power supply board, the first array of spring probe connector pins being connected to the force terminals of the first and second power supply circuits and engaging first power supply contact elements of the device interface board and the second array of spring probe connector pins being connected to the return terminals of the first and second power supply circuits and engaging second power supply contact elements of the device interface board.

6. A test head according to claim 1, comprising a plurality of power supply boards mounted to the power distribution board at the first side thereof, and wherein the power distribution board has a substantially circular periphery and the power supply boards are positioned radially with respect to the periphery of the power distribution board.

7. A test head according to claim 1, wherein the power distribution board has a central opening and the test head further comprises a fan for inducing a flow of cooling air through the central opening of the power distribution board.

8. A test head according to claim 1, wherein the device interface board comprises a control signal contact pad at said one side thereof, the power supply circuit includes a control circuit for selectively controlling operation of the power supply circuit, the power supply board comprises a control signal connector for electrically conductive pressure contact with the control signal contact pad of the device interface board for delivering a control signal to the power supply circuit, and the control circuit is responsive to said control signal for controlling operation of the power supply circuit.

9. A test head according to claim 1, wherein the power connector comprises a power connection block attached to the power supply board at an edge thereof and an array of spring probe connector pins mounted in the power connection block and in electrically conductive pressure contact with the power supply contact elements of the device interface board.

10. A test head according to claim 9, wherein the device interface board comprises control signal contact pads at said one side thereof, the power supply circuit includes a control circuit for selectively controlling operation of the power supply circuit, the power supply board includes at least one control signal connector pin mounted in the power connection block and in electrically conductive pressure contact with a control signal contact pad of the device interface board for delivering a control signal to the power supply circuit, and the control circuit is responsive to said control signal for controlling operation of the power supply circuit.

11. A test head according to claim 1, wherein the power supply contact elements each comprise a via having an end that is exposed at said one side of the device interface board and an annular contact pad that surrounds the end of the via, and the power connector comprises a plurality of spring probe connector pins for engaging the power supply contact elements respectively.

12. A test head according to claim 11, wherein the spring probe connector pins have conical tips and each via has an end region that is hollow and terminates at said one side of the device interface board for receiving the tip of a spring probe connector pin.

13. An apparatus for testing an integrated circuit device under test (DUT) having a power input terminal for receiving current for powering the DUT, input terminals for receiving test signals, and output terminals for forwarding output signals that the DUT generates in response to the test signals, the apparatus comprising:
   a plurality of tester channels for generating the test signals and for processing the DUT's output signals to determine how the DUT's output signals behave,
   a plurality of power modules, wherein each power module has a power output terminal and is operative to deliver an output current to the power output terminal, and
   a device interface structure for delivering the test signals from the tester channels to the DUT's input terminals, for delivering the DUT's output signals to the tester channels, and for delivering the output current from the power output terminal of each power module to the DUT's power input terminal.

14. An apparatus according to claim 13, wherein each power module includes a DC/DC converter.

15. An apparatus according to claim 13, wherein the device interface structure is part of a test head that also includes a chassis, and the power modules are installed in the chassis.

* * * * *